US012671304B2

(12) United States Patent
Miyahara et al.

(10) Patent No.: US 12,671,304 B2
(45) Date of Patent: Jun. 30, 2026

(54) LINEAR MOTION DEVICE AND ELECTRONIC COMPONENT MOUNTING DEVICE

(71) Applicant: Panasonic Intellectual Property Management Co., Ltd., Osaka (JP)

(72) Inventors: Ryotaro Miyahara, Osaka (JP); Ryo Fujita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 637 days.

(21) Appl. No.: 17/929,753

(22) Filed: Sep. 6, 2022

(65) Prior Publication Data

US 2023/0096476 A1     Mar. 30, 2023

(30) Foreign Application Priority Data

Sep. 29, 2021     (JP) ................................. 2021-158749

(51) Int. Cl.
| | |
|---|---|
| *H02K 41/02* | (2006.01) |
| *H02K 9/22* | (2006.01) |
| *H05K 13/04* | (2006.01) |

(52) U.S. Cl.
CPC .............. *H02K 41/02* (2013.01); *H02K 9/22* (2013.01); *H05K 13/046* (2013.01)

(58) Field of Classification Search
CPC .......... H02K 41/02; H02K 9/22; H02K 11/33; H02K 9/223; H02K 41/031; H05K 13/046; H05K 13/0406
See application file for complete search history.

(56) References Cited

U.S. PATENT DOCUMENTS

| | | | |
|---|---|---|---|
| 2002/0113498 A1 | 8/2002 | Emoto | |
| 2010/0060724 A1* | 3/2010 | Yamauchi .......... | H05K 13/0406 |
| | | | 348/61 |

(Continued)

FOREIGN PATENT DOCUMENTS

| | | |
|---|---|---|
| JP | 2002-93686 | 3/2002 |
| JP | 2002-247830 | 8/2002 |

(Continued)

OTHER PUBLICATIONS

Rout et.al., "Process development challenges for heatsink assembly using thermally conductive adhesive", Proceedings of SMTA International, Sep. 28-Oct. 23, 2020, p. 106-115. (Year: 2020).*

*Primary Examiner* — Thomas J Hong
*Assistant Examiner* — Jose K Abraham
(74) *Attorney, Agent, or Firm* — Wenderoth, Lind & Ponack, L.L.P.

(57)     ABSTRACT

A linear motion device includes: a base that extends in a reference direction; a linear guide mechanism that includes a guide rail fixed to the base and extending in the reference direction and a slider supported movably on the guide rail along the reference direction; a moving body that is fixed to the slider and that is movable in the reference direction together with the slider; a linear motor that includes a stator fixed to the base, the stator including a magnet row and extending in the reference direction, and a mover including a plurality of coils provided with a certain gap from the stator; and a heat transfer body that is disposed between the moving body and the mover and that is connected to the moving body and the mover, and the heat transfer body extends in a direction away from the linear guide mechanism.

13 Claims, 9 Drawing Sheets

(56)          References Cited

U.S. PATENT DOCUMENTS

| 2011/0052348 | A1* | 3/2011 | Hanamura | H02K 11/0141 |
| | | | | 310/12.13 |
| 2011/0100252 | A1* | 5/2011 | Fukukawa | H02K 41/031 |
| | | | | 104/293 |
| 2014/0292111 | A1 | 10/2014 | Miyamoto | |
| 2019/0111525 | A1* | 4/2019 | Okamura | H02K 41/031 |
| 2019/0350112 | A1* | 11/2019 | Yamada | H05K 13/04 |
| 2020/0390011 | A1* | 12/2020 | Yamakage | H05K 13/0408 |
| 2021/0152054 | A1* | 5/2021 | Kato | H02K 9/227 |

FOREIGN PATENT DOCUMENTS

| JP | 2004-129441 | 4/2004 |
| JP | 2004-289911 | 10/2004 |
| JP | 2004-320879 | 11/2004 |
| JP | 2008-108950 | 5/2008 |
| JP | 2009-100509 | 5/2009 |
| JP | 2013-106497 | 5/2013 |
| JP | 2013-212024 | 10/2013 |
| JP | 2014-194847 | 10/2014 |
| JP | 2016-220294 | 12/2016 |
| WO | 2019/035181 | 2/2019 |

* cited by examiner

LINEAR MOTION DEVICE AND ELECTRONIC COMPONENT MOUNTING DEVICE

BACKGROUND

1. Technical Field

The present disclosure relates to a linear motion device that moves a moving body by a linear motor, and an electronic component mounting device including the linear motion device.

2. Description of the Related Art

As a linear motion device that moves a moving body, a device using a linear motor as a drive device is known. Since the linear motor does not include a mechanical power transmission portion, deterioration of positioning accuracy of the moving body due to deformation, abrasion, or the like of components forming the linear motion device is reduced, which is suitable for highly accurate positioning.

The moving body moves by being connected to a mover of the linear motor, but since the mover generates heat when energized, when the heat is transferred to the moving body, the moving body is thermally deformed and the positioning accuracy of the moving body is deteriorated. Therefore, Japanese Patent Unexamined Publication No. 2013-212024 discloses a linear motion device that efficiently cools a mover by providing a ventilation path through which cooling air flows between the mover and the moving body (top plate), and that prevents heat generated from the mover from being transferred to the moving body by connecting the mover and the moving body via a heat insulating member.

CITATIONS LIST

Patent Literature

PTL 1: Unexamined Japanese Patent Publication No. 2013-212024

SUMMARY

A linear motion device according to the present disclosure includes: a base that extends in a reference direction; a linear guide mechanism that includes a guide rail fixed to the base and extending in the reference direction and a slider supported movably on the guide rail along the reference direction; a moving body that is fixed to the slider and that is movable in the reference direction together with the slider; a linear motor that includes a stator fixed to the base, the stator including a magnet row and extending in the reference direction, and a mover including a plurality of coils provided with a certain gap from the stator; and a heat transfer body that is disposed between the moving body and the mover and that is connected to the moving body and the mover, and the heat transfer body extends in a direction away from the linear guide mechanism.

DETAILED DESCRIPTIONS

A linear motion device disclosed in Japanese Patent Unexamined Publication No. 2013-212024 includes a pair of guide rails, linear guides (sliders) supported by the guide rails, and a mover disposed between the pair of guide rails. The linear motion device further includes a moving body connected to the mover and fixed to the linear guides. The moving body is movable along the guide rails. In the linear motion device having such a configuration, in a space surrounded by the moving body, the guide rails, and the linear guides, the mover is disposed close to these parts. Therefore, there is a problem that even when a ventilation path or a heat insulating member is interposed between the mover and the moving body, it is inevitable that heat generated from the mover is transferred to the moving body, the guide rails, and the linear guides due to thermal radiation or convection, and positioning accuracy of the moving body deteriorates due to thermal deformation of these members.

The present disclosure has been made in view of such a problem, and a main object thereof is to provide a linear motion device that prevents thermal deformation of a moving body, guide rails, and linear guides due to heat generated from a mover and that increases positioning accuracy of the moving body.

Hereinafter, embodiments of the present disclosure will be described in detail with reference to drawings. The present disclosure is not limited to the following embodiments. Further, the present disclosure can be appropriately changed without departing from the scope of the effect of the present disclosure.

First Embodiment

Figure 1:
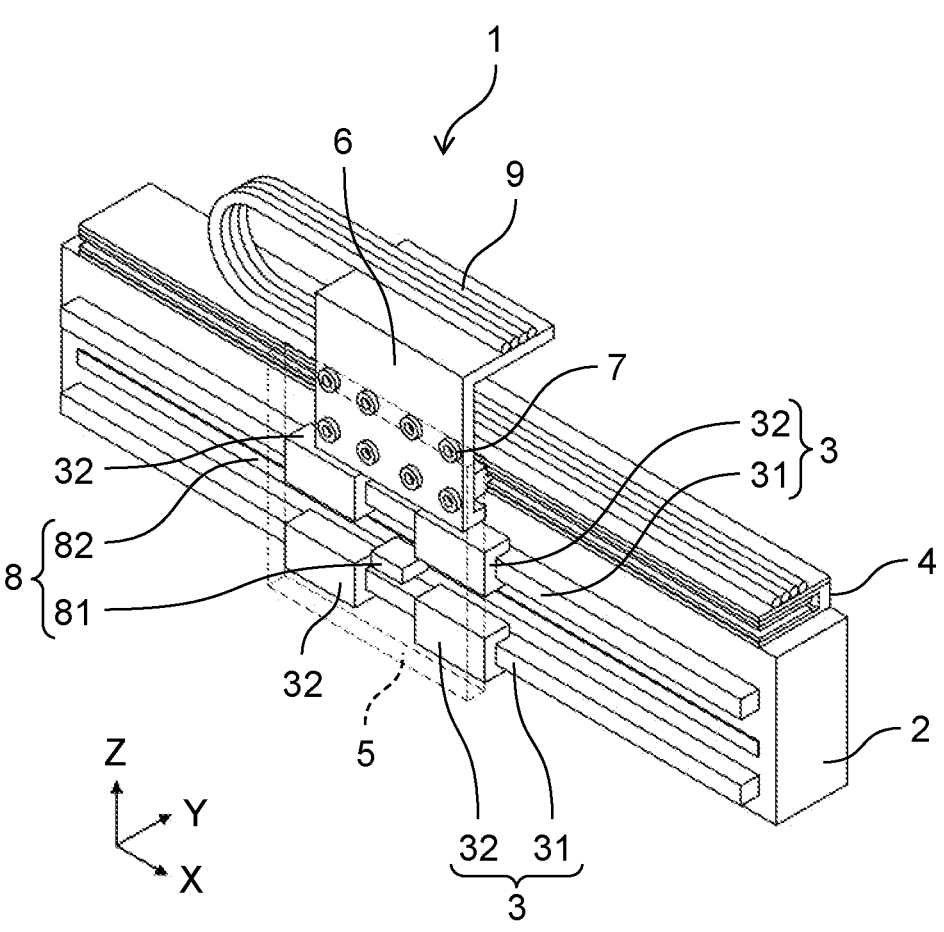
FIG. 1 is a perspective view showing a configuration of a linear motion device according to a first embodiment of the present disclosure.
Figure 2:
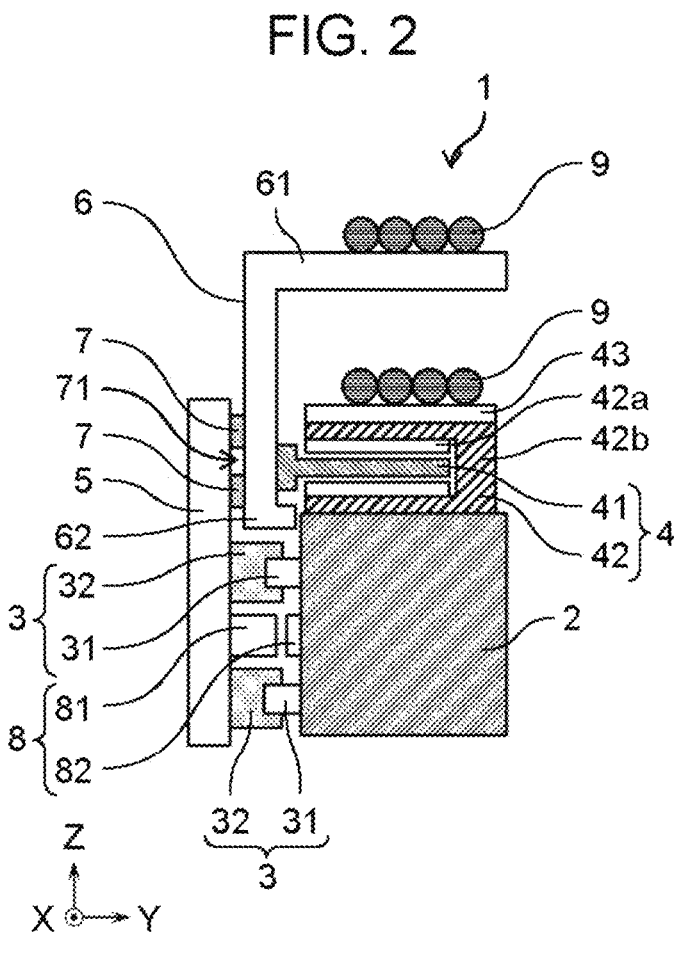
FIG. 2 is a cross-sectional view showing the configuration of the linear motion device according to the first embodiment of the present disclosure.

FIG. 1 is a perspective view schematically showing a configuration of a linear motion device according to a first embodiment of the present disclosure, and FIG. 2 is a cross-sectional view schematically showing the configuration of the linear motion device.

In the following description, a direction in which a moving body moves (reference direction) is referred to as an X direction, a horizontal direction orthogonal to the X direction is referred to as a Y direction, and a vertical direction orthogonal to the X direction is referred to as a Z direction.

As shown in FIG. 1, linear motion device 1 includes base 2, linear guide mechanism 3, linear motor 4, moving body 5, heat transfer body 6, spacers 7, position sensor 8, power supply cable 9, and control unit (not shown).

Base 2 is formed in a rectangular parallelepiped shape extending in the X direction. Linear guide mechanism 3 includes guide rails 31 and sliders 32. Guide rail 31 extends in the X direction and is fixed to base 2 with bolts or the like. A plurality of guide rails 31 may be provided. In the present embodiment, two guide rails 31 are provided apart from each other in the Z direction.

Guide rail 31 supports slider 32 to be movable in the X direction along guide rail 31. A plurality of sliders 32 may be provided. In the present embodiment, two sliders 32 are provided for each guide rail 31, and a total of four sliders 32 are provided.

It is desirable that an engaging portion between guide rail 31 and slider 32 includes a rolling element. Accordingly, a frictional force generated between guide rail 31 and slider 32 can be reduced, and a lost motion at positioning of moving body 5 to be described later can be reduced.

As shown in FIG. 2, linear motor 4 includes stator 42 and mover 41. Stator 42 includes a series of magnet rows 42*a* that are disposed facing each other with a gap in the Z direction and that extend in the X direction and frame 42*b* with a C-shaped cross section that holds magnet rows 42*a*. Stator 42 is fixed to an upper surface of base 2. Support portion 43 that supports power supply cable 9 is provided on an upper surface of stator 42.

Mover 41 is formed in a rectangular parallelepiped shape and includes a plurality of coils (not shown) therein. Mover 41 is disposed between magnet rows 42*a* with a constant gap from each of upper and lower magnet rows. Mover 41 is fixed to heat transfer body 6 to be described later by bolts or the like. The plurality of coils are electrically connected to a control unit via power supply cable 9.

When the plurality of coils are energized, magnetism is generated around the plurality of coils, and a pulling force is generated between the coils and magnet rows 42*a*. Accordingly, a propulsive force in the X direction is applied to mover 41.

It is desirable that linear motor 4 is disposed such that mover 41 is located above linear guide mechanism 3. Since air heated in the vicinity of mover 41 is likely to flow upward, by disposing mover 41 above linear guide mechanism 3, heat transfer due to convection from mover 41 to linear guide mechanism 3 and moving body 5 to be described later can be prevented.

Moving body 5 is formed in a plate shape extending in the X direction and the Z direction, for example. A lower side of moving body 5 is fixed to sliders 32 with bolts or the like. An upper side of moving body 5 is fixed to heat transfer body 6 with bolts or the like via spacers 7 to be described later. In FIG. 1, so that the internal structure can be seen, moving body 5 is indicated by dotted lines as a transparent portion.

Heat transfer body 6 connected to mover 41 extends in a direction (Z direction) away from linear guide mechanism 3. Further, heat transfer body 6 includes a near end close to linear guide mechanism 3 and a far end far from linear guide mechanism 3. Heat transfer body 6 includes, at the far end, bent portion 61 extending in a direction (Y direction) away from moving body 5. Accordingly, heat transfer body 6 is formed such that a cross-sectional shape perpendicular to the X direction is an L shape. Bent portion 61 may extend to be inclined with respect to the Y direction. In addition, heat transfer body 6 may include heat insulating portion 62 that blocks radiant heat from mover 41 at the near end.

It is desirable that heat transfer body 6 is formed of a material having a high thermal conductivity such as aluminum or copper. Accordingly, the heat generated from mover 41 can be efficiently transferred to heat transfer body 6, and the heat transferred from mover 41 can be dissipated to the atmosphere. Further, heat transfer body 6 may include a heat dissipation fin. Accordingly, a heat dissipation area can be increased, and a heat dissipation efficiency of heat transfer body 6 can be increased. Further, heat transfer body 6 (for example, bent portion 61) may include a support portion that supports one side of power supply cable 9. The other side of power supply cable 9 is fixed to, for example, support portion 43 provided on an upper surface of the linear motor 4.

Spacer 7 is formed in a cylindrical shape, for example. The plurality of spacers 7 are disposed between moving body 5 and heat transfer body 6 with a gap from each other such that ventilation path 71 penetrating in the X direction is provided. Accordingly, an air layer is formed between moving body 5 and heat transfer body 6, and heat transfer between heat transfer body 6 and moving body 5 is prevented. By providing ventilation path 71 in the direction (X direction) in which moving body 5 moves, an air flow is generated between moving body 5 and heat transfer body 6, and the heat dissipation effect can be increased.

It is preferable that the ventilation path penetrating in the Z direction is further provided between the plurality of spacers 7. Accordingly, warmed air around heat transfer body 6 is likely to flow upward, and the heat dissipation effect of heat transfer body 6 can be increased.

It is preferable that spacer 7 is made of a material having a low thermal conductivity, such as resin or stainless steel. Accordingly, the heat transfer from heat transfer body 6 to moving body 5 can be prevented.

Position sensor 8 includes linear scale 82 and sensor head 81. Linear scale 82 extends in the X direction to be substantially parallel to guide rails 31, and is fixed to base 2. Sensor head 81 is fixed to moving body 5 such that reading portion of sensor head 81 faces linear scale 82. By the reading portion of sensor head 81 acquiring position information recorded on a surface of linear scale 82, a relative position of moving body 5 with respect to base 2 in the X direction can be acquired.

The control unit (not shown) acquires the position information from sensor head 81, and outputs a driving signal (current) to the plurality of coils based on a difference between the relative position of moving body 5 with respect to base 2 and a target position of moving body 5. When the plurality of coils are energized, the propulsive force is applied to mover 41, and moving body 5 moves relative to base 2 in the X direction.

In the present embodiment, mover 41 is disposed at a position away from linear guide mechanism 3. That is, mover 41 is disposed at a position that is not restrained by the space surrounded by moving body 5, guide rails 31, and sliders 32. Therefore, heat transfer body 6 connected to mover 41 can be disposed to extend in the direction (Z direction) away from linear guide mechanism 3. Accordingly, since the heat generated by mover 41 can be rapidly dissipated via heat transfer body 6, a temperature of mover 41 can be rapidly lowered. As a result, since the heat generated from mover 41 can be significantly prevented from being transferred to moving body 5, guide rails 31, and sliders 32 by the radiant heat and the convection, the thermal deformation of these members is prevented, and the positioning accuracy of moving body 5 can be improved.

Figures 3A, 3B:
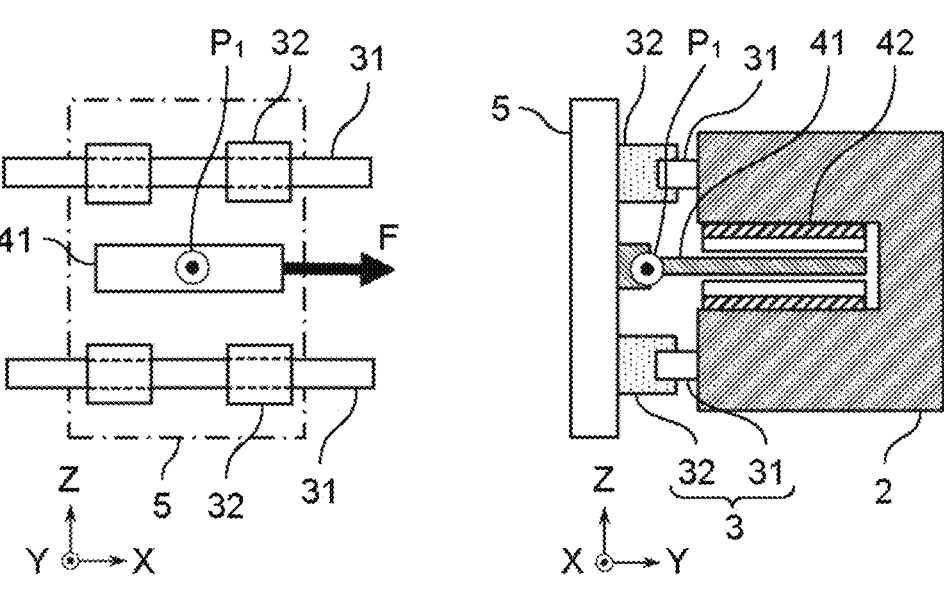
FIG. 3A is a diagram showing a configuration of a linear motion device in the related art.
FIG. 3B is a diagram showing the configuration of the linear motion device in the related art.

In the linear motion device in the related art, as shown in FIGS. 3A and 3B, mover 41 is disposed between the pair of guide rails 31. In this case, gravity center position $P_1$ of a movable part including moving body 5, mover 41, and sliders 32 is positioned in the vicinity of mover 41 in the Z direction. Therefore, since the movable part receives, in the vicinity of gravity center position $P_1$ of the movable part, thrust force F generated by mover 41 when linear motor 4 is operated, couple of forces generated in the movable part are small.

Figure 4A:
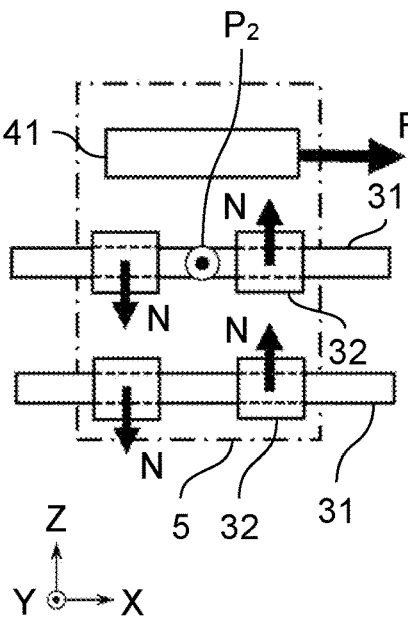
FIG. 4A is a diagram showing a configuration of the linear motion device in which a mover is disposed in a direction away from a linear guide mechanism.
Figure 4B:
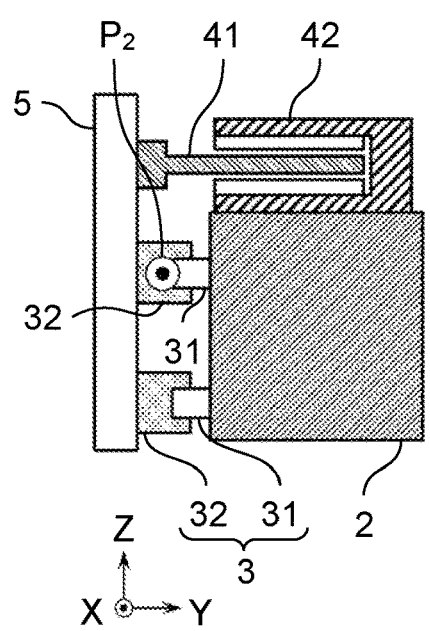
FIG. 4B is a diagram showing the configuration of the linear motion device in which the mover is disposed in the direction away from the linear guide mechanism.

On the other hand, as shown in FIGS. 4A and 4B, when mover 41 is disposed in the direction (Z direction) away from linear guide mechanism 3, gravity center position $P_2$ of the movable part including moving body 5, mover 41, and sliders 32 is at a position away from mover 41 in the Z direction. Therefore, since the movable part receives thrust force F generated by mover 41 when linear motor 4 is operated at a position away from gravity center position $P_1$ of the movable part, couple of forces are generated in the movable part.

As shown in FIG. 4A, the couple of forces N act in a direction (mainly, the Z direction) other than a moving direction (X direction) of sliders 32 on sliders 32 that movably support moving body 5. Therefore, sliders 32 and rolling elements interposed between sliders 32 and guide rails 31 are elastically deformed by the couple of forces N, and a sliding resistance between guide rails 31 and sliders 32 increases. Further, directions of the couple of forces N are reversed depending on a direction of thrust force F, that is, the moving direction of moving body 5. As a result, the lost motion is increased in the positioning of moving body 5.

Figure 5A:
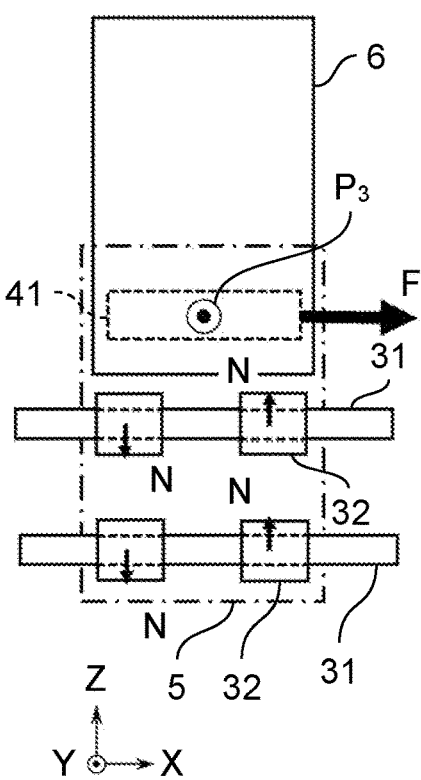
FIG. 5A is a diagram showing a configuration of the linear motion device according to the first embodiment.
Figure 5B:
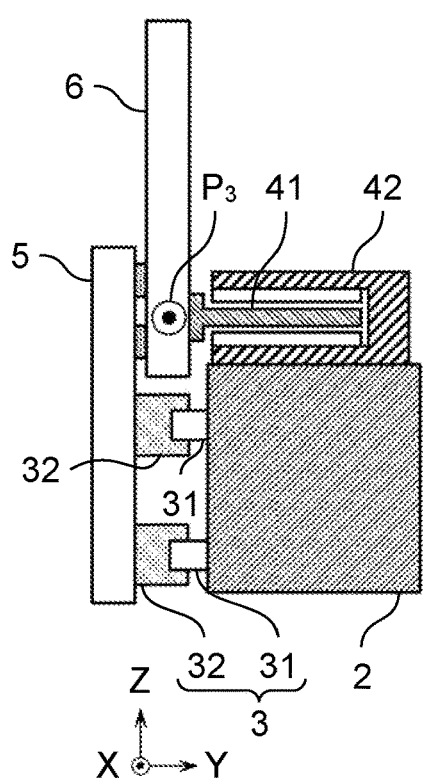
FIG. 5B is a diagram showing the configuration of the linear motion device according to the first embodiment.

On the other hand, in the present embodiment, as shown in FIGS. 5A and 5B, heat transfer body 6 connected to mover 41 disposed in the direction away from linear guide mechanism 3 is disposed to extend in the direction (mainly, the Z direction) away from linear guide mechanism 3. Therefore, by adjusting the configuration of heat transfer body 6, for example, a length of heat transfer body 6 in the Z direction, gravity center position $P_3$ of the movable part including moving body 5, heat transfer body 6, mover 41, and sliders 32 can be made close to the vicinity of mover 41 in the Z direction.

With such a configuration, in the present embodiment, as shown in FIG. 5A, thrust force F generated by mover 41 can be received in the vicinity of gravity center position $P_3$ of the movable part, so that couple of forces N applied to sliders 32 can be reduced. As a result, the elastic deformation of sliders 32 and the rolling elements interposed between sliders 32 and guide rails 31 can be prevented, the sliding resistance between guide rails 31 and sliders 32 can be reduced, and the lost motion at the positioning of moving body 5 can be prevented.

Figure 6A:
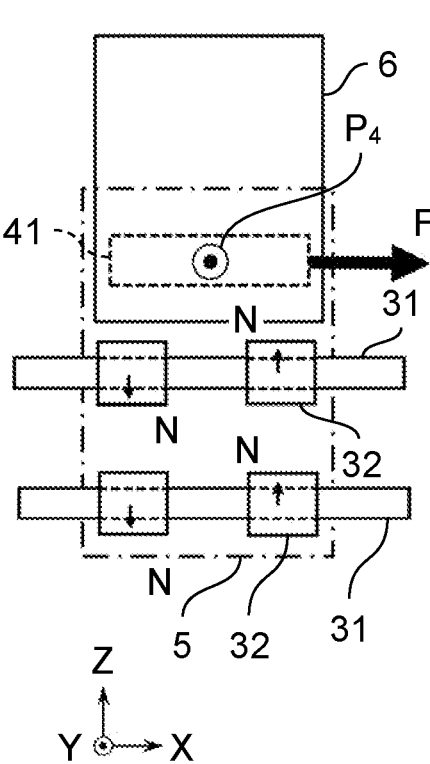
FIG. 6A is a diagram showing another configuration of the linear motion device according to the first embodiment.
Figure 6B:
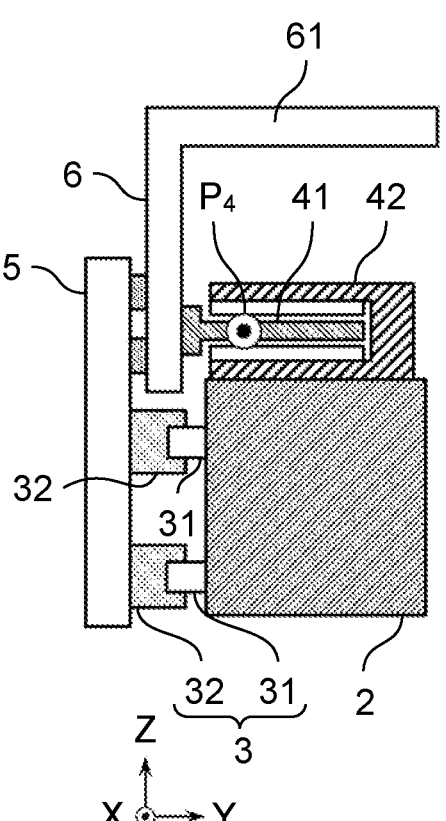
FIG. 6B is a diagram showing the another configuration of the linear motion device according to the first embodiment.

Further, as shown in FIGS. 6A and 6B, bent portion 61 extending in the direction (Y direction) away from moving body 5 may be provided at an opposite-side end portion of heat transfer body 6 with respect to linear guide mechanism 3. Accordingly, gravity center position $P_4$ of the movable part including moving body 5, heat transfer body 6, mover 41, and sliders 32 can be made closer to the vicinity of a center portion of mover 41. As a result, couple of forces N applied to sliders 32 can be further reduced, and the lost motion at the positioning of moving body 5 can be further prevented.

As shown in FIG. 2, when power supply cable 9 is disposed at bent portion 61 of heat transfer body 6, it is preferable to adjust the configuration of heat transfer body 6 including bent portion 61 such that the gravity center position of the movable part including power supply cable 9 is made close to the vicinity of mover 41. In this case, since a mass of power supply cable 9 received by bent portion 61 changes depending on the position of moving body 5, it is preferable that the gravity center position of the movable part including power supply cable 9 is obtained at an intermediate position of a stroke of moving body 5, for example.

Modification of First Embodiment

Figure 7:
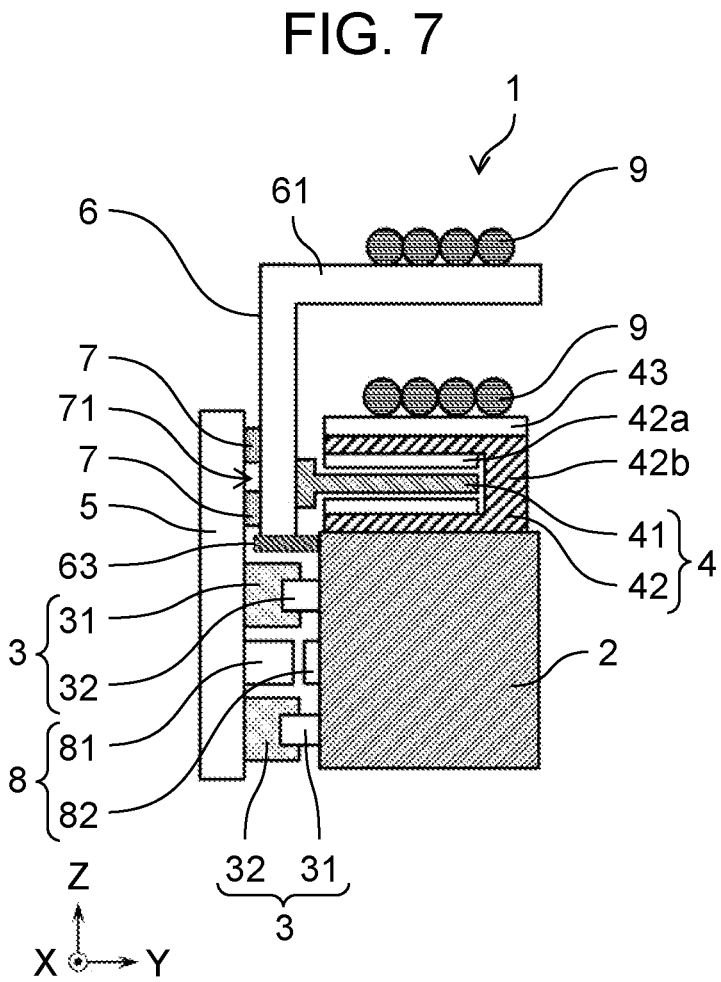
FIG. 7 is a cross-sectional view showing a configuration of a linear motion device according to a modification of the first embodiment.

FIG. 7 is a cross-sectional view schematically showing a configuration of linear motion device 1 according to a modification of the first embodiment. In linear motion device 1 shown in FIG. 2, heat insulating portion 62 that blocks the radiant heat from mover 41 is provided at the end portion of heat transfer body 6 on a linear guide mechanism 3 side, but in the present modification, heat insulating member 63 that blocks the radiant heat from mover 41 is provided at the end portion of heat transfer body 6 on the linear guide mechanism 3 side. Accordingly, the heat transfer by radiation from mover 41 to moving body 5 and linear guide mechanism 3 is prevented. It is preferable that heat insulating member 63 is made of, for example, a material having a low thermal conductivity such as resin or stainless steel. Accordingly, an amount of heat transferred from heat transfer body 6 to heat insulating member 63 is reduced, and the air in the vicinity of linear guide mechanism 3 is prevented from being heated by heat insulating member 63.

Figure 8:
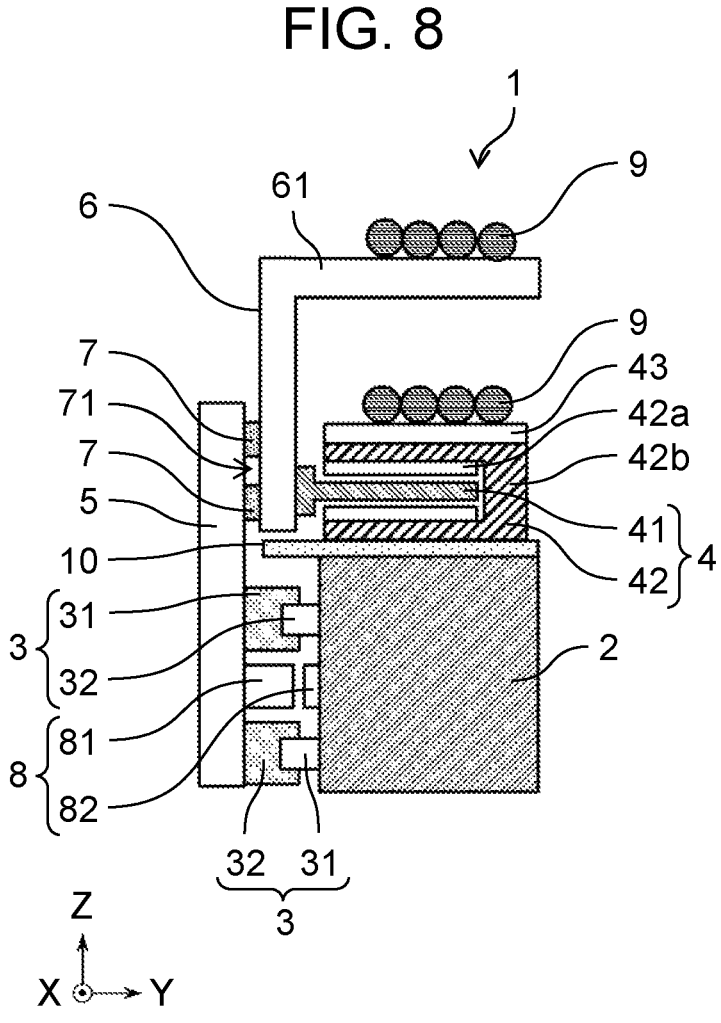
FIG. 8 is a cross-sectional view showing a configuration of a linear motion device according to another modification of the first embodiment.

Further, as shown in FIG. 8, heat insulating plate 10 that is fixed to base 2 and that blocks the radiant heat from mover 41 may be provided between stator 42 and linear guide mechanism 3. Accordingly, an amount of the heat radiated from heat transfer body 6 to moving body 5 and linear guide mechanism 3 is reduced, and the heat transfer from heat transfer body 6 to moving body 5 and linear guide mechanism 3 is prevented. In addition, since the convection in the Z direction with heat insulating plate 10 as a boundary is prevented, the heat transfer due to the convection from mover 41 and heat transfer body 6 to moving body 5 and linear guide mechanism 3 is prevented.

A first surface of heat transfer body 6 facing mover 41 may be coated with a substance that absorbs the radiant heat from mover 41. The substance that promotes absorption of the radiant heat is, for example, a blackbody coating material, alumite, or the like. Accordingly, the amount of the radiant heat absorbed by heat transfer body 6 increases, and the heat dissipation efficiency of heat transfer body 6 can be increased.

It is preferable that the first surface of heat transfer body 6 facing moving body 5 is a mirror surface. Accordingly, the amount of the heat radiated from heat transfer body 6 to moving body 5 and linear guide mechanism 3 is reduced, and the heat transfer from heat transfer body 6 to moving body 5 and linear guide mechanism 3 is prevented.

Second Embodiment

Figure 9:
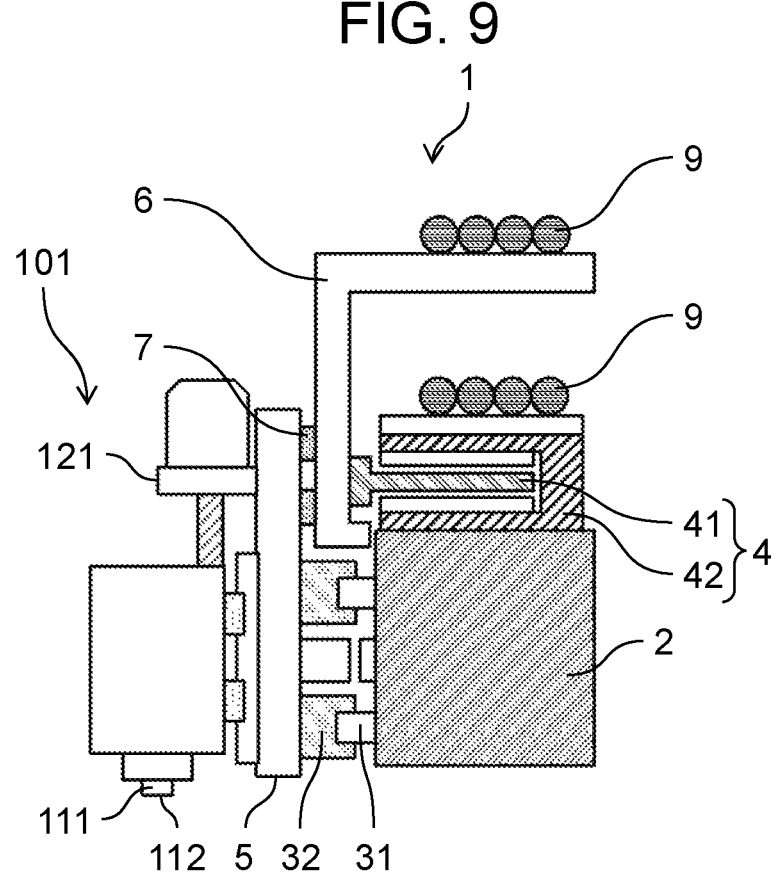
FIG. 9 is a cross-sectional view showing a configuration of an electronic component mounting device according to a second embodiment of the present disclosure.
Figure 10:
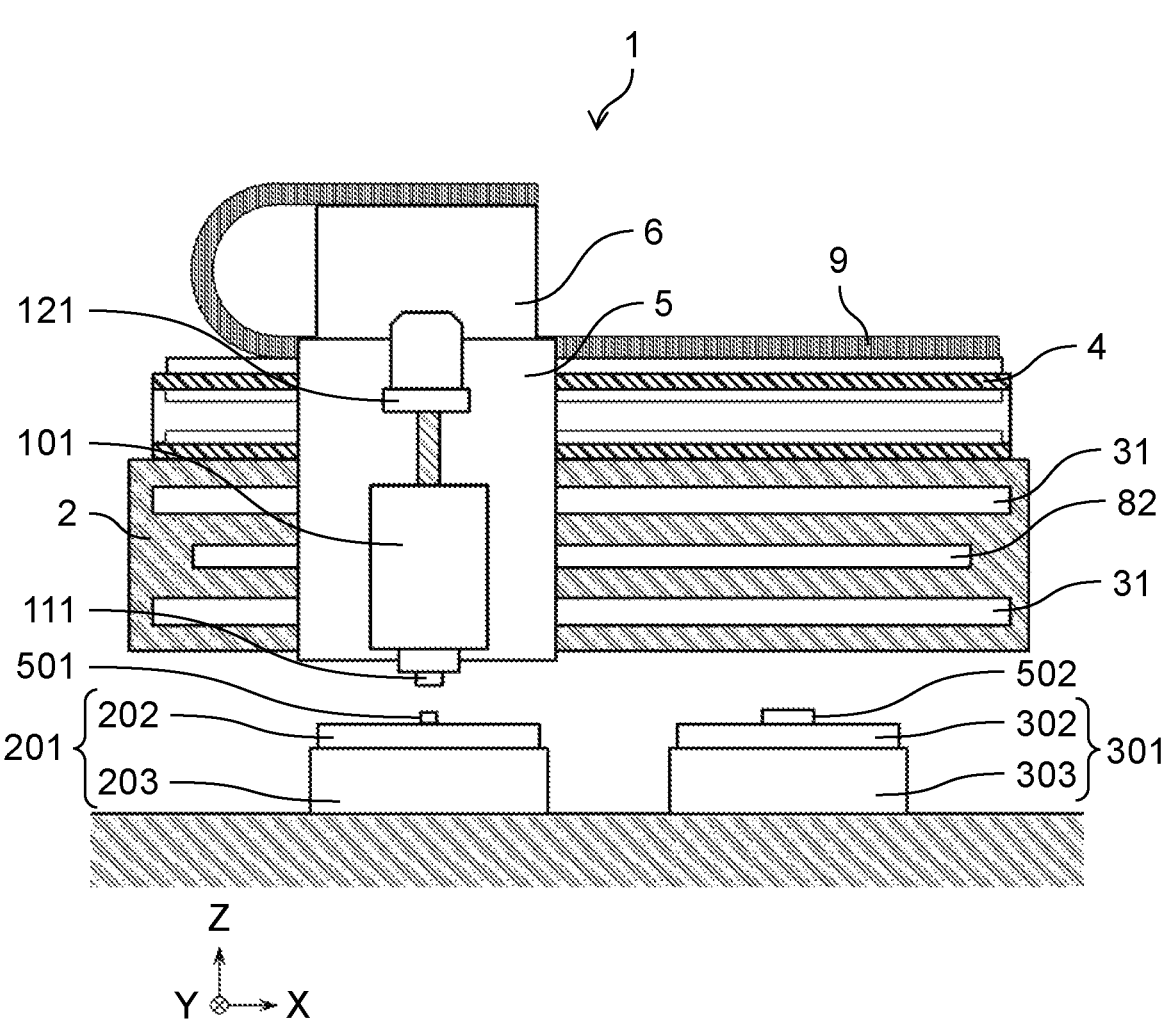
FIG. 10 is a front view showing the configuration of the electronic component mounting device according to the second embodiment of the present disclosure.

FIGS. 9 and 10 are views schematically showing a configuration of an electronic component mounting device according to a second embodiment of the present disclosure.

As shown in FIG. 9, the electronic component mounting device according to the present embodiment is an electronic component mounting device that mounts an electronic component on a substrate, and includes linear motion device 1 according to the first embodiment, and mounting head 101 that is fixed to moving body 5 of linear motion device 1 and that mounts the electronic component on the substrate.

Mounting head 101 includes suction nozzle 111 and head drive mechanism 121. Head drive mechanism 121 is provided on moving body 5 and supports suction nozzle 111 to be movable relative to moving body 5 in the Z direction. Suction nozzle 111 includes suction hole 112 on a lower surface thereof. By supplying a negative pressure or a positive pressure to suction nozzle 111, suction nozzle 111 performs suction holding and release of the component.

Head drive mechanism 121 includes a servo motor, a stepping motor, a linear motor, or the like, and relatively moves suction nozzle 111 in the Z direction with respect to component 501 disposed on component supply stage 201 to be described later and substrate 502 disposed on substrate supply stage 301.

Linear motion device 1 moves moving body 5 along the X direction to move suction nozzle 111 directly above component supply stage 201 (first position) and directly above substrate supply stage 301 (second position) to be described later.

As shown in FIG. 10, component supply stage 201 includes stage 202 that supports component 501 and stage drive mechanism 203. Component supply stage 201 is disposed such that an upper surface of stage 202 faces suction nozzle 111 at the first position. Stage drive mechanism 203 includes an actuator such as a servo motor, a stepping motor, or a linear motor, and relatively moves component 501 in a rotation direction (Θ direction) around the X direction, the Y direction, and the Z direction as a rotation axis with respect to mounting head 101.

Substrate supply stage 301 includes stage 302 that supports substrate 502, stage drive mechanism 303, and a mounting position measuring sensor (not shown). Substrate supply stage 301 is disposed such that an upper surface of stage 302 faces suction nozzle 111 at the second position. Stage drive mechanism 303 includes an actuator such as a servo motor, a stepping motor, or a linear motor, and relatively moves stage 302 in the X direction, the Y direction, and the Θ direction with respect to mounting head 101.

The mounting position measuring sensor includes at least one camera or the like. The mounting position measuring sensor measures a relative position and a relative angle of component 501 sucked and held by suction nozzle 111 and substrate 502 disposed on the upper surface of stage 302 on a horizontal plane.

Head drive mechanism 121 and stage drive mechanism 203 described above are provided for a purpose of relatively moving suction nozzle 111 and component 501 in the Z direction, the X direction, the Y direction, and the Θ direction. These relative movements may be performed by either or both of mounting head 101 and component supply stage 201. For example, suction nozzle 111 may be relatively moved in the Z direction, the X direction, the Y direction, and the Θ direction with respect to fixed stage 202.

The same applies to head drive mechanism 121 and stage drive mechanism 303, and the relative movement between suction nozzle 111 and substrate 502 may be performed by either or both of mounting head 101 and substrate supply stage 301.

Next, a mounting operation of the electronic component mounting device according to the present embodiment will be described.

By driving linear motion device 1 and stage drive mechanism 203 by the control unit (not shown), suction nozzle 111 moves to the first position, and component 501 moves directly below suction nozzle 111. By driving head drive mechanism 121 by the control unit, suction nozzle 111 moves downward. When a distance between an upper surface of component 501 and the lower surface of suction nozzle 111 is a predetermined distance, or when the upper surface of component 501 and the lower surface of suction nozzle 111 come into contact with each other, the movement of suction nozzle 111 is stopped. By supplying a negative pressure to suction hole 112, suction nozzle 111 sucks and holds component 501. By driving head drive mechanism 121, suction nozzle 111 moves upward by a predetermined amount in a state where component 501 is sucked and held. By driving linear motion device 1 and stage drive mechanism 303, suction nozzle 111 moves to the second position in a state where component 501 is sucked and held, and substrate 502 is moved directly below suction nozzle 111.

Substrate 502 is moved to a predetermined mounting position and a mounting angle by driving stage drive mechanism 303 based on the relative position and the relative angle of component 501 and substrate 502 on the horizontal plane acquired from the mounting position measuring sensor. By driving head drive mechanism 121, suction nozzle 111 moves downward in a state where component 501 is sucked and held. When a distance between an upper surface of substrate 502 and a lower surface of component 501 is a predetermined distance, or when the upper surface of substrate 502 and the lower surface of component 501 come into contact with each other, the movement of suction nozzle 111 is stopped. By supplying a positive pressure to suction hole 112, suction nozzle 111 releases component 501. By driving head drive mechanism 121, suction nozzle 111 moves upward by a predetermined amount.

With the above operation, component 501 is disposed on substrate 502 at the mounting position and the mounting angle.

A vertical movement direction of suction nozzle 111 slightly changes for each mounting operation due to the thermal deformation of components of linear motion device 1 and mounting head 101, the lost motion of moving body 5, and the like. Component 501 sucked and held by suction nozzle 111 is disposed on substrate 502 by linearly moving suction nozzle 111 downward after component 501 and substrate 502 are positioned at the mounting position. Therefore, when an inclination of suction nozzle 111 in the vertical movement direction is large, a difference between the relative position acquired by the mounting position measuring sensor and the relative position of component 501 disposed on substrate 502 and substrate 502 increases. That is, mounting accuracy of component 501 on substrate 502 is deteriorated.

In the linear motion device of the present disclosure, the thermal deformation of the components of linear motion device 1 and mounting head 101 and the lost motion of moving body 5 can be reduced, so that a change in the inclination of suction nozzle 111 in the vertical movement direction for each mounting operation can be reduced. Therefore, component 501 can be mounted on substrate 502 with high accuracy.

Figure 11:
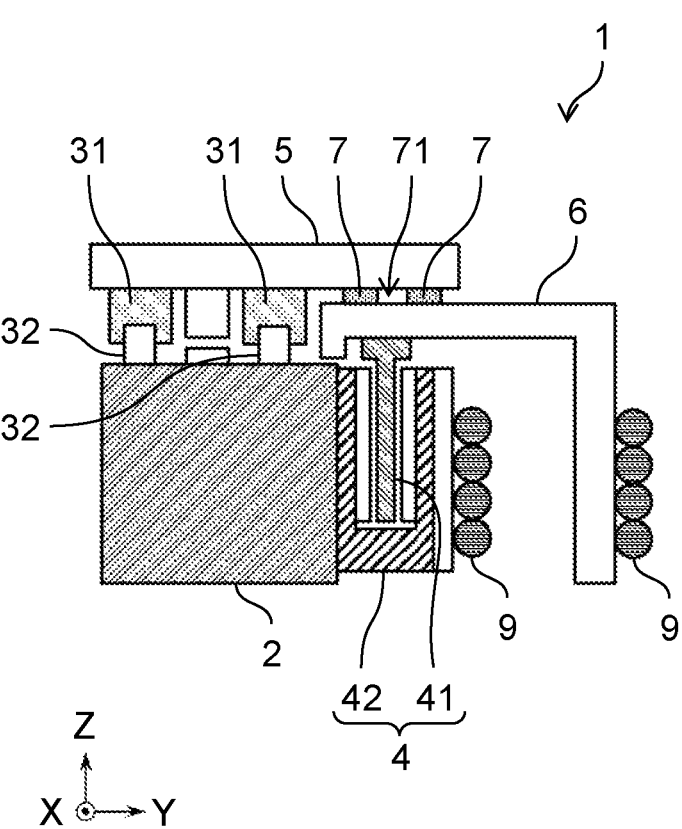
FIG. 11 is a cross-sectional view showing a configuration of a linear motion device according to another embodiment of the present disclosure.

Although the present disclosure has been described above by way of preferred embodiments, such description is not a limitation, and various modifications may be made. For example, in the above embodiment, in linear motion device 1 shown in FIGS. 1 and 2, mover 41 is disposed to extend in the Y direction (horizontal direction), and moving body 5 and heat transfer body 6 are disposed to extend in the Z direction (vertical direction), but the present disclosure is not limited thereto, for example, as shown in FIG. 11, mover 41 may be disposed to extend in the Z direction (vertical direction), and the moving body 5 and the heat transfer body 6 may be disposed to extend in the Y direction (horizontal direction). It is no doubt that mover 41, moving body 5, and heat transfer body 6 may be disposed in other directions.

In the above embodiment, an example in which linear motion device 1 is applied to the electronic component mounting device has been described, but the present disclosure is not limited thereto, and can be applied to applications including transport, assembly, and positioning of all components. Linear motion device 1 may be used as a stage drive device in which moving body 5 is implemented as a stage.

According to the present disclosure, it is possible to provide the linear motion device that prevents the thermal deformation of the moving body, the guide rails, and the linear guides due to the heat generated from the mover and that increases the positioning accuracy of the moving body.

What is claimed is:

1. A linear motion device that moves a moving body by a linear motor, when a moving direction of the moving body is defined as an X direction, a horizontal direction perpendicular to the X direction is defined as a Y direction, and a direction perpendicular to the X direction and the Y direction is defined as a Z direction, the linear motion device comprising:

a base that extends in the X direction;
a linear guide mechanism that includes
   a plurality of guide rails fixed to the base and extending in the X direction, and
   a slider supported movably on each of the guide rails along the X direction;
the moving body that is fixed to the sliders and that is movable in the X direction together with the sliders;
the linear motor that includes
   a stator fixed to the base, the stator including a magnet row and extending in the X direction, and
   a mover including a plurality of coils provided with a certain gap from the stator; and
a heat transfer body that is disposed between the moving body and the mover in the Y direction and that is connected to the moving body and the mover,
wherein the linear motor is fixed to an upper surface of the base in the Z direction, and is disposed above all the guide rails in the Z direction,
wherein the heat transfer body is disposed above all the guide rails in the Z direction,
wherein the heat transfer body includes a near end close to the linear guide mechanism and a far end far from the linear guide mechanism, and wherein the heat transfer body includes, at the far end, a bent portion extending in a direction away from the moving body in the Y direction.

2. The linear motion device of claim 1,
wherein the mover is disposed at a position above the linear guide mechanism in the Z direction.

3. The linear motion device of claim 1,
wherein the heat transfer body is connected to the moving body via at least one spacer.

4. The linear motion device of claim 1,
wherein the heat transfer body includes a heat dissipation fin.

5. The linear motion device of claim 1,
wherein the heat transfer body includes, at the near end, a heat insulating portion that blocks radiant heat from the mover.

6. The linear motion device of claim 1, further comprising:
between the stator and the linear guide mechanism, a heat insulating plate that is fixed to the base and that blocks radiant heat from the mover.

7. The linear motion device of claim 1,
wherein the heat transfer body has a first surface facing the mover,
wherein the first surface is coated with a substance that absorbs radiant heat from the mover, and
wherein the substance is a blackbody coating material or alumite.

8. The linear motion device of claim 1,
wherein the heat transfer body has a first surface facing the moving body, and
wherein the first surface is a mirror surface.

9. The linear motion device of claim 3,
wherein the at least one spacer includes two parallel spacers extending in the X direction, and
wherein a ventilation path penetrating in the X direction is provided between the two parallel spacers.

10. The linear motion device of claim 1,
wherein the heat transfer body includes a support portion that supports a power supply cable connected to the mover on an upper side of the bent portion of the heat transfer body extending in a direction away from the moving body in the Y direction.

11. An electronic component mounting device that mounts an electronic component on a substrate, the electronic component mounting device comprising:
the linear motion device of claim 1; and
a mounting head that is fixed to the moving body and that mounts the electronic component on the substrate.

12. A linear motion device, comprising:
a base that extends in a reference direction;
a linear guide mechanism that includes
   a guide rail fixed to the base and extending in the reference direction, and
   a slider supported movably on the guide rail along the reference direction;
a moving body that is fixed to the slider and that is movable in the reference direction together with the slider;
a linear motor that includes
   a stator fixed to the base, the stator including a magnet row and extending in the reference direction, and
   a mover including a plurality of coils provided with a certain gap from the stator; and
a heat transfer body that is disposed between the moving body and the mover and that is connected to the moving body and the mover, wherein the heat transfer body extends in a direction away from the linear guide mechanism, wherein the heat transfer body has a first surface facing the moving body, and wherein the first surface is a mirror surface.

13. A linear motion device that moves a moving body by a linear motor, when a moving direction of the moving body is defined as an X direction, a horizontal direction perpendicular to the X direction is defined as a Y direction, and a direction perpendicular to the X direction and the Y direction is defined as a Z direction, the linear motion device comprising:

a base that extends in the X direction;

a linear guide mechanism that includes a guide rail fixed to the base and extending in the X direction, and a slider supported movably on the guide rail along the X direction;

the moving body that is fixed to the slider and that is movable in the X direction together with the slider;

the linear motor that includes a stator fixed to the base, the stator including a magnet row and extending in the X direction, and a mover including a plurality of coils provided with a certain gap from the stator; and a heat transfer body that is disposed between the moving body and the mover in the Y direction and that is connected to the moving body and the mover, wherein the linear motor is fixed to an upper surface of the base in the Z direction, and does not face the linear guide mechanism in the Y direction, and wherein the heat transfer body is disposed above the linear guide mechanism in the Z direction, and does not face the linear guide mechanism in the Y direction, wherein the heat transfer body has a first surface facing the mover, wherein the first surface is coated with a substance that absorbs radiant heat from the mover, and wherein the substance is a blackbody coating material or alumite.

\* \* \* \* \*